United States Patent
Liu

(10) Patent No.: US 11,948,772 B2
(45) Date of Patent: Apr. 2, 2024

(54) METHODS AND APPARATUSES FOR ADJUSTING BEAM CONDITION OF CHARGED PARTICLES

(71) Applicant: ASML Netherlands B.V., Veldhoven (NL)

(72) Inventor: Xuedong Liu, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 18/102,766

(22) Filed: Jan. 30, 2023

(65) Prior Publication Data
US 2023/0170180 A1    Jun. 1, 2023

Related U.S. Application Data

(63) Continuation of application No. 16/651,344, filed as application No. PCT/EP2018/075928 on Sep. 25, 2018, now Pat. No. 11,569,060.

(Continued)

(51) Int. Cl.
*H01J 37/26* (2006.01)
*H01J 37/12* (2006.01)
(Continued)

(52) U.S. Cl.
CPC ............ *H01J 37/265* (2013.01); *H01J 37/12* (2013.01); *H01J 37/141* (2013.01); *H01J 37/1474* (2013.01); *H01J 37/28* (2013.01)

(58) Field of Classification Search
CPC .. H01J 37/00; H01J 37/02; H01J 37/26; H01J 37/265; H01J 37/12; H01J 37/141; H01J 37/1474; H01J 37/28
(Continued)

(56) References Cited

U.S. PATENT DOCUMENTS

| 4,514,638 | A | | 4/1985 | Lischke et al. |
| 6,066,849 | A | * | 5/2000 | Masnaghetti ........... H01J 37/28 |
| | | | | 250/310 |

(Continued)

FOREIGN PATENT DOCUMENTS

| CN | 101414124 A | 4/2005 |
| CN | 103456589 A | 12/2013 |

(Continued)

OTHER PUBLICATIONS

International Search Report issued in related PCT International Application No. PCT/EP2018/075928, dated Dec. 4, 2018 (2 pgs.).

(Continued)

*Primary Examiner* — Jason L McCormack
(74) *Attorney, Agent, or Firm* — Finnegan, Henderson, Farabow, Garrett & Dunner, LLP

(57) ABSTRACT

Apparatus and methods for adjusting beam condition of charged particles are disclosed. According to certain embodiments, the apparatus includes one or more first multipole lenses displaced above an aperture, the one or more first multipole lenses being configured to adjust a beam current of a charged-particle beam passing through the aperture. The apparatus also includes one or more second multipole lenses displaced below the aperture, the one or more second multipole lenses being configured to adjust at least one of a spot size and a spot shape of the beam.

20 Claims, 9 Drawing Sheets

Related U.S. Application Data

(60) Provisional application No. 62/566,149, filed on Sep. 29, 2017.

(51) Int. Cl.
*H01J 37/141* (2006.01)
*H01J 37/147* (2006.01)
*H01J 37/28* (2006.01)

(58) Field of Classification Search
USPC .......................... 250/306, 307, 311, 396 ML
See application file for complete search history.

(56) References Cited

U.S. PATENT DOCUMENTS

| | | | |
|---|---|---|---|
| 6,693,282 | B1 | 2/2004 | Tiemeiier |
| 2004/0113092 | A1* | 6/2004 | Knippelmeyer ........ H01J 37/12 250/396 R |
| 2005/0045821 | A1* | 3/2005 | Noji ................... G01N 23/2204 250/311 |
| 2005/0194535 | A1* | 9/2005 | Noji ........................ G06T 7/001 250/311 |
| 2006/0113494 | A1 | 6/2006 | Chen et al. |
| 2007/0069150 | A1 | 3/2007 | Frosien |
| 2009/0084954 | A1 | 4/2009 | Ezumi et al. |

FOREIGN PATENT DOCUMENTS

| | | |
|---|---|---|
| EP | 1110233 | 6/2001 |
| JP | S 58-071545 | 4/1983 |
| JP | S 61-021179 | 1/1986 |
| JP | S 61-021182 | 1/1986 |
| JP | H01-143217 | 6/1989 |
| JP | 2001-093455 | 4/2001 |
| JP | 2002-524827 | 8/2002 |
| JP | 2002-352759 | 12/2002 |
| JP | 2003-502823 | 1/2003 |
| JP | 2009-099540 | 5/2009 |
| JP | 2009-164109 | 7/2009 |
| JP | 2015-531984 | 11/2015 |
| JP | 2016-009684 | 1/2016 |
| TW | 201037755 A | 10/2010 |
| TW | 201241865 A1 | 10/2012 |
| TW | 201732259 A | 9/2017 |
| WO | WO 98/32153 | 7/1998 |

OTHER PUBLICATIONS

Notice of Reasons for Rejection issued in related Japanese Patent Application No. 2020-515079; dated Apr. 14, 2021 (13 pgs.).
Office Action of the Intellectual Property Office issued in related Taiwanese Patent Application No. 109123229; dated Sep. 14, 2021 (12 pgs.).
First Office Action from the Patent Office of the People's Republic of China issued in related Chinese Patent Application No. 2018800634535; dated Mar. 30, 2022 (26 pgs.).
Notice of Deficiencies from the Israel Patent Office issued in related Israeli Patent Application No. 273525; dated Jun. 28, 2023 (3 pgs.).

* cited by examiner

METHODS AND APPARATUSES FOR ADJUSTING BEAM CONDITION OF CHARGED PARTICLES

CROSS-REFERENCE TO RELATED APPLICATIONS

This application is a continuation of U.S. patent application Ser. No. 16/651,344, filed on Mar. 26, 2020, which claims priority of national stage filing under 35 U.S.C. § 371 of International Application No. PCT/EP2018/075928, filed on Sep. 25, 2018, and published as WO 2019/063530 A1, which claims priority of U.S. Provisional Application No. 62/566,149, which was filed on Sep. 29, 2017, all of which are incorporated herein by reference in their entireties.

TECHNICAL FIELD

The present disclosure generally relates to inspection of manufactured substrates by using charged particles, and more particularly, to methods and apparatuses for adjusting beam condition of the charged particles.

BACKGROUND

A charged particle (e.g., electron) beam microscope, such as a scanning electron microscope (SEM) or a transmission electron microscope (TEM), capable of resolution down to less than a nanometer, serves as a practicable tool for inspecting IC components having a feature size that is from sub-micron down to a few nanometers. With the SEM, electrons of a single primary electron beam, or electrons of a plurality of primary electron beams, can be focused at predetermined scan locations of a wafer under inspection. The primary electrons interact with the wafer and may be backscattered or may cause the wafer to emit secondary electrons, which can be collected by a detector or detectors and used to construct an image of the wafer. The intensity of the electron beams comprising the backscattered electrons and the secondary electrons may vary based on the properties of the internal and/or external structures of the wafer, and thus indicates whether the wafer has defects.

In a lot of application cases, in order to inspect defects by voltage contrast, before an area of the wafer is inspected with the primary electrons, charged particles are applied onto the area in a process called pre-charging, which serves two purposes: first, reducing the charging on the wafer surface that would cause defocus and distortion of images; and second, applying a proper voltage to features on the wafer, so that defective and surrounding non-defective features behave differently under the inspection. Currently, pre-charging can be realized by two techniques—flooding and pre-scanning.

In the flooding technique, a flooding gun, which is a separate electron source from the primary electron source, is used to provide a relatively large amount of electrons to charge a predefined surface area on the wafer, while the wafer is moved under the flooding gun. After the pre-scanning, the wafer is moved back to its original position and then the primary electron beam(s) is/are applied to scan a part of the pre-charged area, so as to image the scanned area. Typically, the time needed for flooding is in the order of minutes, and the time needed for switching between pre-charging and imaging is in the order of seconds. Evidently, the flooding technique is time consuming and reduces the system throughput.

In the pre-scanning technique, the primary beam(s) is/are used for both pre-charging and imaging. Specifically, prior to an imaging scan, the primary beam(s) is/are first used to pre-scan an area of the wafer to be imaged, in order to pre-charge the wafer positively or negatively. Compared to the flooding technique, the pre-scanning technique has a relatively short switching time between pre-scanning and imaging. Moreover, the pre-charged area in the pre-scanning technique can be precisely controlled because only one electron source is used.

When the pre-scanning technique is used for pre-charging, normally a small beam current of the primary electrons is sufficient for equilibrating the state of the surface charging and/or forming voltage contrast for defects with low leakage rate. However, some electrical defects with high leakage rate, such as a thin void in copper interconnects, require a large amount of electrons to build up charging in order to be detected. Hence, it is necessary to apply higher beam current of the primary electrons during pre-scanning in order to achieve the adequate amount of pre-charging.

SUMMARY

Embodiments of the present disclosure relate to methods and apparatus for changing beam conditions of charged particles. In some embodiments, an apparatus is provided. The apparatus includes one or more first multipole lenses displaced above an aperture, the one or more first multipole lenses being configured to adjust a beam current of a charged-particle beam passing through the aperture. The apparatus also includes one or more second multipole lenses displaced below the aperture, the one or more second multipole lenses being configured to adjust at least one of a spot size and a spot shape of the beam.

In some embodiments, an apparatus is provided. The apparatus includes one or more first non-rotational axially-symmetric lenses displaced above the aperture, the one or more first non-rotational axially-symmetric lenses being configured to adjust a beam current of a charged-particle beam passing through the aperture. The apparatus also includes one or more second non-rotational axially-symmetric lenses displaced below the aperture, the one or more second non-rotational axially-symmetric lenses being configured to adjust at least one of a spot size or a spot shape of the beam.

In some embodiments, a method is provided. The method includes adjusting, by one or more first multipole lenses displaced above an aperture, a beam current of a charged-particle beam passing through the aperture. The method also includes adjusting, by one or more second multipole lenses displaced below the aperture, at least one of a spot size or a spot shape of the beam.

In some embodiments, a non-transitory computer-readable medium is provided. The non-transitory computer-readable medium stores instructions that, when executed by one or more processors, cause the processors to perform a method including: controlling one or more first multipole lenses displaced above an aperture, to adjust a beam current of a charged-particle beam passing through the aperture; and controlling one or more second multipole lenses displaced below the aperture, to adjust at least one of a spot size or a spot shape of the beam.

Additional objects and advantages of the disclosed embodiments will be set forth in part in the following description, and in part will be apparent from the description, or may be learned by practice of the embodiments. The objects and advantages of the disclosed embodiments may be realized and attained by the elements and combinations set forth in the claims.

It is to be understood that both the foregoing general description and the following detailed description are exemplary and explanatory only and are not restrictive of the disclosed embodiments, as claimed.

DESCRIPTION OF THE EMBODIMENTS

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The present application discloses apparatuses and methods for adjusting beam conditions of charged particles. The disclosed apparatuses and methods may be used in many technologies, such as in manufacturing processes of integrated circuits (ICs). As used in the present disclosure, beam condition refers to one or more of beam current, spot size, and spot shape of a charged-particle beam. Charged particles refer to any positively or negatively charged particles, such as electrons, protons, charged molecules, positive or negative ions, etc. For illustrative purpose only, the following description assumes the charged particles are electrons. However, the principles and embodiments of the present disclosure can be equally applied to other types of charged particles.

As used herein, unless specifically stated otherwise, the term "or" encompasses all possible combinations, except where infeasible. For example, if it is stated that a database can include A or B, then, unless specifically stated otherwise or infeasible, the database can include A, or B, or A and B. As a second example, if it is stated that a database can include A, B, or C, then, unless specifically stated otherwise or infeasible, the database can include A, or B, or C, or A and B, or A and C, or B and C, or A and B and C.

Figure 1:
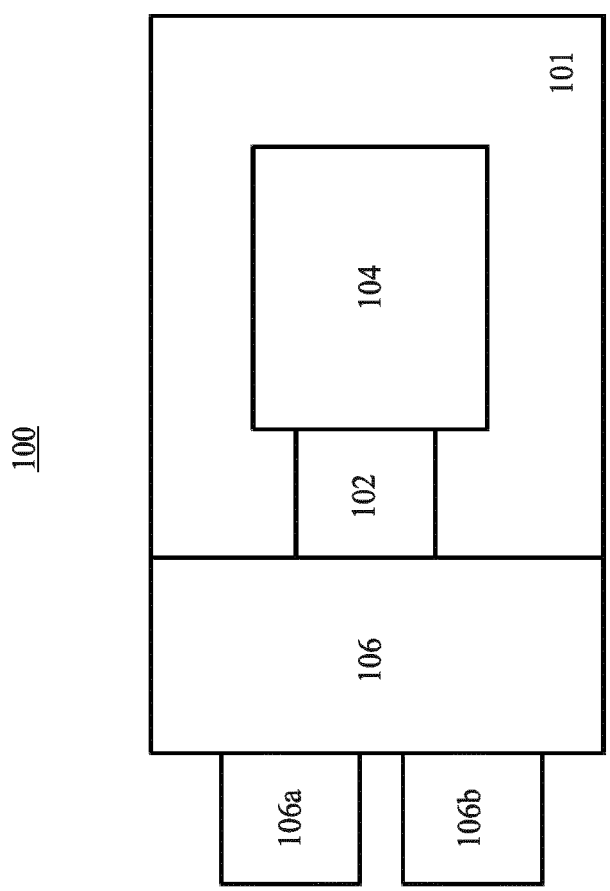
FIG. 1 is a schematic diagram illustrating an exemplary electron-beam inspection (EBI) system, consistent with embodiments of the present disclosure.

FIG. 1 is a schematic diagram illustrating an exemplary electron-beam inspection (EBI) system 100 consistent with embodiments of the present disclosure. As shown in FIG. 1, EBI system 100 includes a main chamber 101, a load/lock chamber 102, an electron-beam (e-beam) tool 104, and an equipment front end module (EFEM) 106. E-beam tool 104 is located within main chamber 101.

EFEM 106 includes a first loading port 106a and a second loading port 106b. EFEM 106 may include additional loading port(s). First loading port 106a and second loading port 106b can receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 106 can transport the wafers to load/lock chamber 102.

Load/lock chamber 102 is connected to a load/lock vacuum pump system (not shown), which removes gas molecules in load/lock chamber 102 to reach a first pressure below the atmospheric pressure. After reaching the first pressure, one or more robot arms (not shown) can transport the wafer from load/lock chamber 102 to main chamber 101. Main chamber 101 is connected to a main chamber vacuum pump system (not shown), which removes gas molecules in main chamber 101 to reach a second pressure below the first pressure. After reaching the second pressure, the wafer is subject to inspection by e-beam tool 104.

Figure 2:
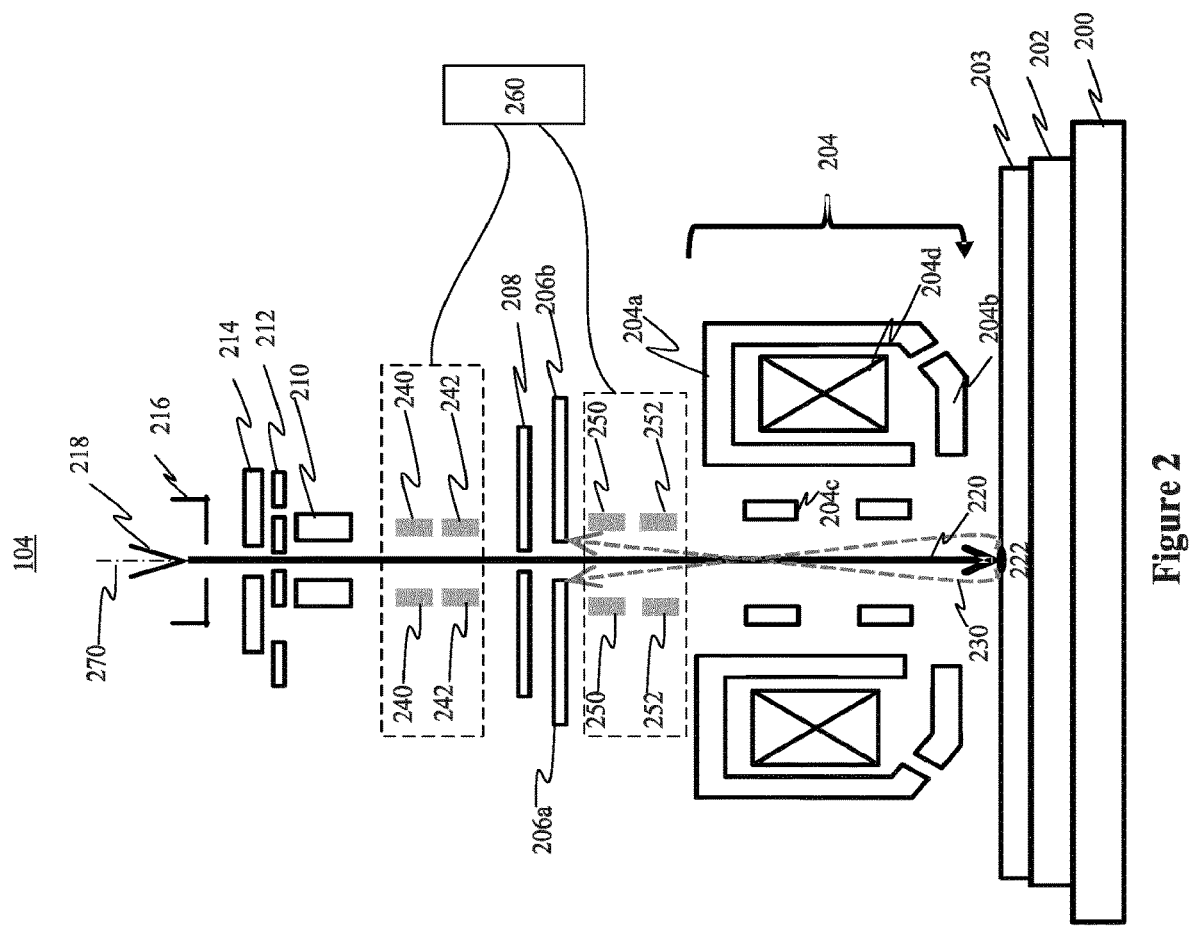
FIG. 2 is a schematic diagram illustrating an exemplary electron-beam (e-beam) tool that can be a part of the exemplary EBI system of FIG. 1, consistent with embodiments of the present disclosure.

FIG. 2 is a schematic diagram illustrating an exemplary e-beam tool 104, consistent with the disclosed embodiments. As shown in FIG. 2, electron beam tool 104 includes a motorized stage 200, and a wafer holder 202 supported by motorized stage 200 to hold a wafer 203 to be inspected. Electron beam tool 104 further includes a compound objective lens 204, electron detector 206 (which includes electron sensor surfaces 206a and 206b), an objective aperture 208, a condenser lens 210, a beam limit aperture 212, a gun aperture 214, an anode 216, and a cathode 218, one or more which may be aligned with an optical axis 270 of e-beam tool 104.

Compound objective lens 204, in some embodiments, can include a modified swing objective retarding immersion lens (SORIL), which includes a pole piece 204a, a control electrode 204b, a deflector or a set of deflectors 204c, and an exciting coil 204d. Electron beam tool 104 may additionally include an energy dispersive X-ray spectrometer (EDS) detector (not shown) to characterize the materials on the wafer.

A primary electron beam 220 is emitted from cathode 218 by applying a voltage between anode 216 and cathode 218. Primary electron beam 220 passes through gun aperture 214 and beam limit aperture 212, both of which can determine the current of electron beam entering condenser lens 210, which resides below beam limit aperture 212. Condenser lens 210 focuses primary electron beam 220 before the beam enters objective aperture 208 to set the current of the electron beam before entering compound objective lens 204.

Compound objective lens 204 can focus primary electron beam 220 onto wafer 203 for inspection and can form a probe spot 222 on surface of wafer 203. Deflector(s) 204c deflect primary electron beam 220 to scan probe spot 222 over wafer 203. For example, in a scanning process, deflector(s) 204c can be controlled to deflect primary electron beam 220 sequentially onto different locations of top surface of wafer 203 at different time points, to provide data for image reconstruction for different parts of wafer 203. Moreover, deflector 204c can also be controlled to deflect primary electron beam 220 onto different sides of wafer 203 at a particular location, at different time points, to provide data for stereo image reconstruction of the wafer structure at that location. Further, in some embodiments, anode 216 and cathode 218 can be configured to generate multiple primary electron beams 220, and electron beam tool 104 can include a plurality of deflectors 204c to project the multiple primary electron beams 220 to different parts/sides of wafer 203 at the same time.

When a current is applied onto exciting coil 204d, an axially-symmetric (i.e., symmetric around optical axis 270) magnetic field will be generated in the wafer surface area. A part of wafer 203 being scanned by primary electron beam 220 can be immersed in the magnetic field. Different voltages are applied onto wafer 203, magnetic objective lens 204a, and control electrode 204b, to generate an axial symmetric retarding electric field near the wafer surface. The electric field reduces the energy of impinging primary electron beam 220 near the surface of the wafer before it collides with wafer 203. Control electrode 204b, being electrically isolated from pole piece 204a, controls an axially-symmetric electric field on the wafer to prevent micro-arcing of the wafer and to ensure proper beam focus at the wafer surface with the axially-symmetric magnetic field together.

A secondary electron beam 230 can be emitted from the part of wafer 203 upon receiving primary electron beam 220. Secondary electron beam 230 can be received by sensor surfaces 206a and 206b of electron detector 206. Electron detector 206 can generate a signal (e.g., a voltage, a current, etc.) that represents an intensity of secondary electron beam 230, and provide the signal to a processing system (not shown in FIG. 2). The intensity of secondary electron beam 230 can vary according to the external and/or internal structure of wafer 203. Moreover, as discussed above, primary electron beam 220 can be projected onto different locations of the top surface of wafer 203, and/or different sides of wafer 203 at a particular location, to generate secondary electron beams 230 of different intensities. Therefore, by mapping the intensity of secondary electron beam 230 with the locations of wafer 203, the processing system can reconstruct an image that reflects the internal and/or external structures of wafer 203.

As described above, when the pre-scanning technique is used for pre-charging wafer 203, it may be needed to frequently adjust the beam current of the primary electrons between the pre-scanning and image scanning (e.g., increasing the beam current of the primary electrons for pre-charging electrical defects with high leakage rate). This may be realized by adjusting the strength of condenser lens 210. Specifically, referring to FIG. 2, condenser lens 210 may be used to change the outer contour of primary electron beam 220, so as to change the amount of primary electrons passing through objective aperture 208.

Consistent with the disclosed embodiments, condenser lens 210 may be magnetic or electrostatic. On one hand, if condenser lens 210 is a magnetic lens, the strength of condenser lens 210 can be adjusted by changing the excitation current of condenser lens 210. However, compared to voltage, excitation current is slow to change and unstable due to large inductance from the magnetic lens's body and coils. Moreover, the magnetic lens has hysteresis problem, which will make the magnetic field different with same excitation current applied. This will cause the primary beam defocus when scanning the wafer. On the other hand, if condenser lens 210 is an electrostatic round lens, it may require a large voltage (e.g., several thousands of volts) to make most of the primary electrons pass through objective aperture 208. Switching between such a large voltage is time consuming. Therefore, condenser lens 210, no matter whether it is a magnetic or electrostatic lens, may not be suitable for controlling pre-charging if high throughput of e-beam tool 104 is desired.

To avoid the above-described limitations associated with condenser lens 210, the present structure provides various structures and methods for using multipole lens to control the beam condition of the primary electrons. As shown in FIG. 2, e-beam tool 104 may include one or more multipole lenses (e.g., multipole lens 240 and/or multipole lens 242) between the source of the primary electrons (i.e., cathode 218) and objective aperture 208. Moreover, e-beam tool 104 may include one or more multipole lenses (e.g., multipole lens 250 and/or multipole lens 252) between objective aperture 208 and wafer 203. The multipole lens are aligned with optical axis 270.

The multipole lenses used in the present disclosure may be any type of lenses that can generate a high order harmonic electric or magnetic field along the optical axis 270. For example, the disclosed multipole lenses may include one or more of quadrupole lenses, octupole lenses, etc. Moreover, the multipole lenses may include at least one electrostatic lens formed by a plurality of electrode, at least one electromagnetic multipole lens formed by a plurality of solenoid coils or electromagnets.

Figure 3B:
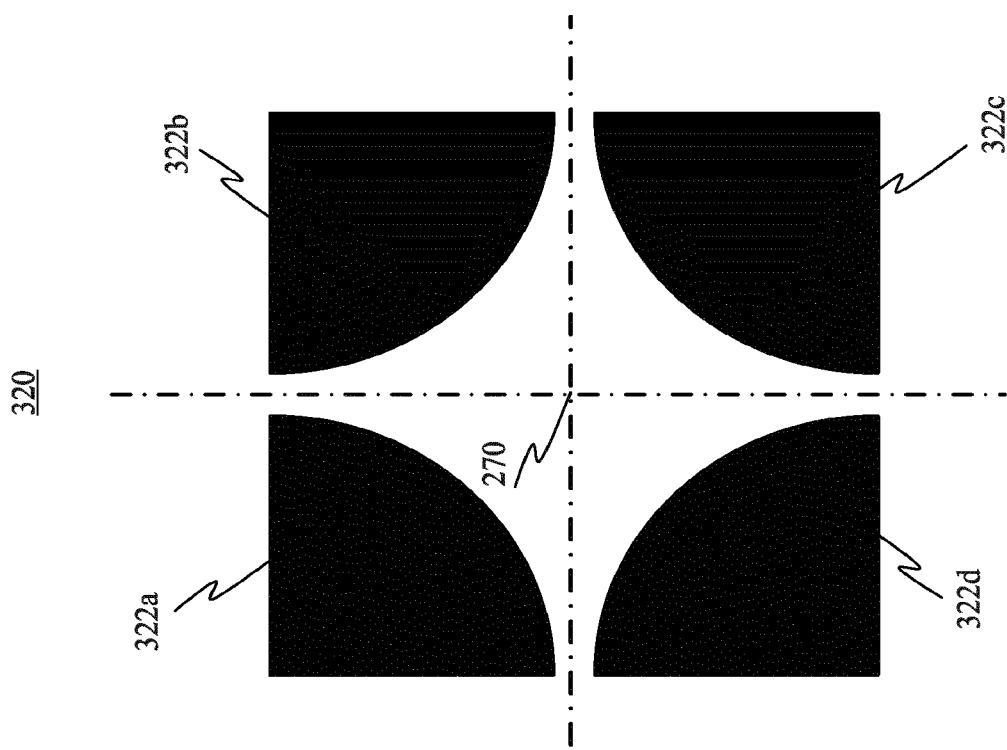
FIG. 3B is a schematic diagram illustrating a quadrupole lens used in the exemplary e-beam tool of FIG. 2, consistent with embodiments of the present disclosure.
Figure 3A:
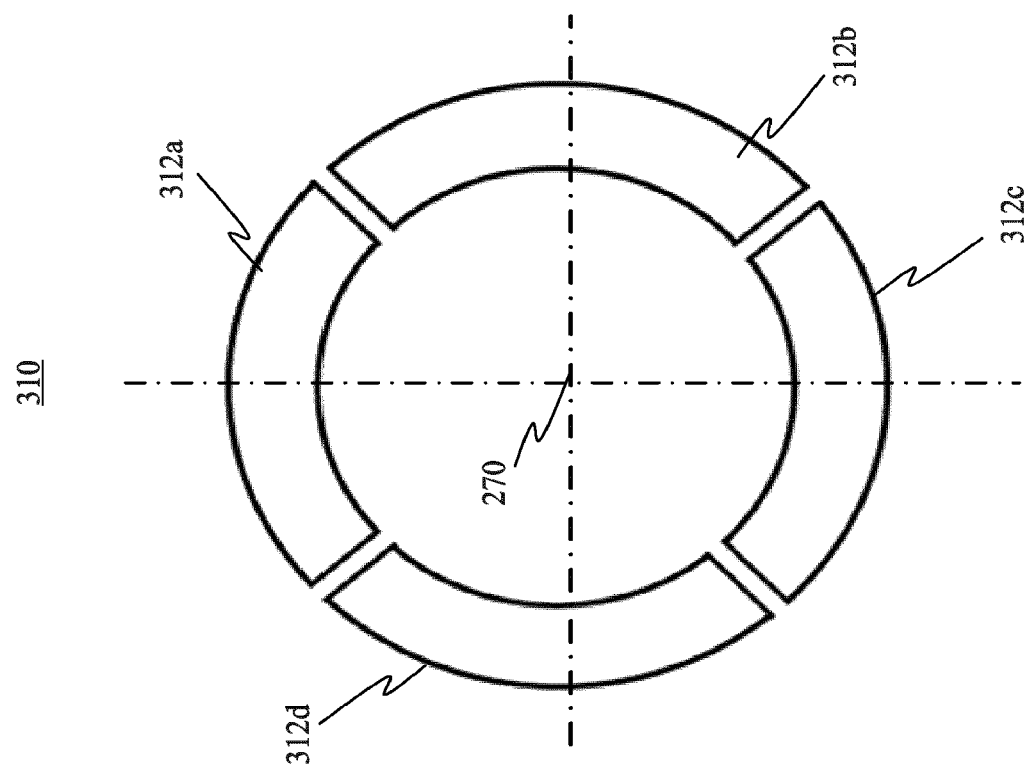
FIG. 3A is a schematic diagram illustrating a quadrupole lens used in the exemplary e-beam tool of FIG. 2, consistent with embodiments of the present disclosure.

FIG. 3A is a schematic diagram illustrating a top view of a quadrupole lens 310 used in e-beam tool 104, according to exemplary embodiments of the present disclosure. Referring to FIG. 3A, quadrupole lens 310 includes four segments 312a-312d. For example, quadrupole lens 310 may be used as one of multipole lenses 240, 242, 250, and 252 in e-beam tool 104 (FIG. 2). Segments 312a-312d may be arranged symmetrically around optical axis 270. When quadrupole lens 310 is an electrostatic quadrupole lens, segments 312a-312d are electrodes. For example, a positive voltage "+V" may be applied to electrodes 312a and 312c, and a negative voltage "—V" may be applied to electrodes 312b and 312d. This way, segments 312a-312d may create an electric quadrupole field symmetrically distributed around optical axis 270. When quadrupole lens 310 is a magnetic quadrupole lens, segments 312a-312d are solenoid coils or electromagnets. With control of the current directions in the solenoid coils, segments 312a-312d may create a magnetic quadrupole field symmetrically distributed around optical axis 270.

The multipole lenses used in the present disclosure may have any suitable shapes. FIG. 3B is a schematic diagram illustrating a top view of a quadrupole lens 320 used in e-beam tool 104, according to exemplary embodiments of the present disclosure. Referring to FIG. 3B, quadrupole lens 320 includes four segments 322a-322d. For example, quadrupole lens 320 may be used as one of multipole lenses 240, 242, 250, and 252 in e-beam tool 104 (FIG. 2).

Segments 312a-312d may be arranged symmetrically around optical axis 270. As shown in FIGS. 3A and 3B, quadrupole lens 310 is configured to be a concave quadrupole lens, while quadrupole lens 320 is configured to be a convex quadrupole lens.

Figure 4:
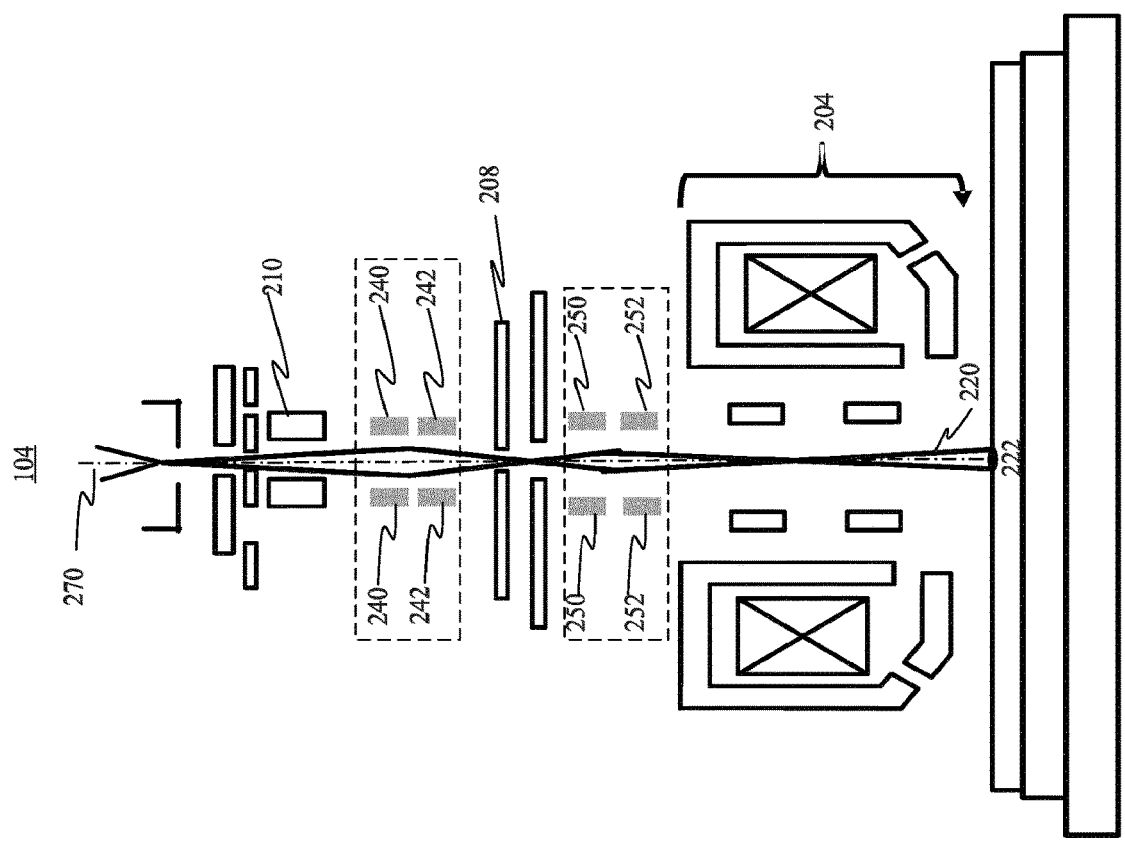
FIG. 4 is a schematic diagram illustrating an e-beam adjusted by multipole lenses included in the exemplary e-beam tool of FIG. 2, consistent with embodiments of the present disclosure.

FIG. 4 is a schematic diagram illustrating an e-beam adjusted by multipole lenses included in e-beam tool 104, consistent with embodiments of the present disclosure. Referring to FIG. 4, multipole lenses 240, 242 are disposed above objective aperture 208 and thus are also referred to as pre-aperture multipole lenses in the present disclosure. In some embodiments, multipole lenses 240, 242 may be disposed below condenser lens 210, which converges primary electron beam 220 before the beam enters multipole lenses 240, 242. FIG. 4 shows the outer contour of primary electron beam 220. As shown by the outer contour, when multipole lenses 240, 242 are switched on, one or more multipole fields can be created to further focus primary electron beam 220, so as to allow more primary electrons passing through objective aperture 208, without changing the setting of condenser lens 210. Moreover, the strength of the one or more multipole fields can be adjusted to change the amount of primary electrons passing through aperture 208. This way, multipole lenses 240, 242 can adjust the beam current of primary electron beam 220 that is allowed to be projected onto wafer 203 without changing the setting of condenser lens 210.

Still referring to FIG. 4, multipole lenses 250, 252 are disposed below objective aperture 208 and thus are also referred to as post-aperture multipole lenses in the present disclose. In some embodiments, multipole lenses 250, 252 may be disposed above compound object lens 204. When multipole lenses 250, 252 are switched on, one or more multipole fields can be created to focus primary electron beam 220 before the beam enters compound object lens 204. As such, the diameter of primary electron beam 220 and thus the size of probe spot 222 can be changed at wafer surface without changing the setting of objective lens 204.

Moreover, the multipole fields of multipole lenses 250, 252 are not rotational symmetric around optical axis 270. In particular, a multipole field (e.g., quadrupole fields) can focus primary electron beam 220 in one transverse direction of the beam, while defocus primary electron beam 220 in another transverse direction of the beam. Thus, the shape of the cross section of primary electron beam 220 and therefore the spot shape of probe spot 222 can be changed by one or more multipole fields generated by multipole lenses 250, 252.

Although FIGS. 2 and 4 show two pre-aperture multipole lenses 240, 242 and two post-aperture multipole lenses 250, 252, the present disclosure does not limit the number of pre-aperture multipole lenses and the number of post-aperture multipole lenses used in the e-beam tools. For example, in some embodiments, e-beam tool 104 may include only one pre-aperture multipole lens, while in some other embodiments, e-beam tool 104 may include more than two pre-aperture multipole lenses.

Moreover, although FIGS. 2 and 4 show e-beam tool 104 uses a single primary electron beam, it is contemplated that e-beam tool 104 may also be a multi-beam inspection tool that uses multiple primary electron beam. The present application does not limit the number of primary electron beams used in e-beam tool 104.

Moreover, the principles and embodiments described in the present disclosed can be applied to any lens capable of generating a non-rotational axially-symmetric field around an optical axis of the e-beam tool. The above-described multipole magnetic/electric field is one example of a non-rotational axially-symmetric field. As used in the present disclosure, a non-rotational axially-symmetric lens refers to a lens capable of generating a non-rotational axially-symmetric field around an axis.

As described above, multipole lenses 240, 242 can be switched on to change the beam current of primary electron beam 220, and multipole lenses 250, 252 can be switched on to change at least one of a spot size or a spot shape of probe spot 222. Also, the strength of the multipole fields generated by multipole lenses 240, 242, 250, 252 can be adjusted by changing the input voltage or current of these multipole lens, so as to precisely control the beam current, spot size, and/or spot shape. Referring to FIG. 2, in the disclosed embodiments, e-beam tool 104 may further include a controller 260 configured to control the input voltage or current of multipole lenses 240, 242, 250, 252.

Figure 5:
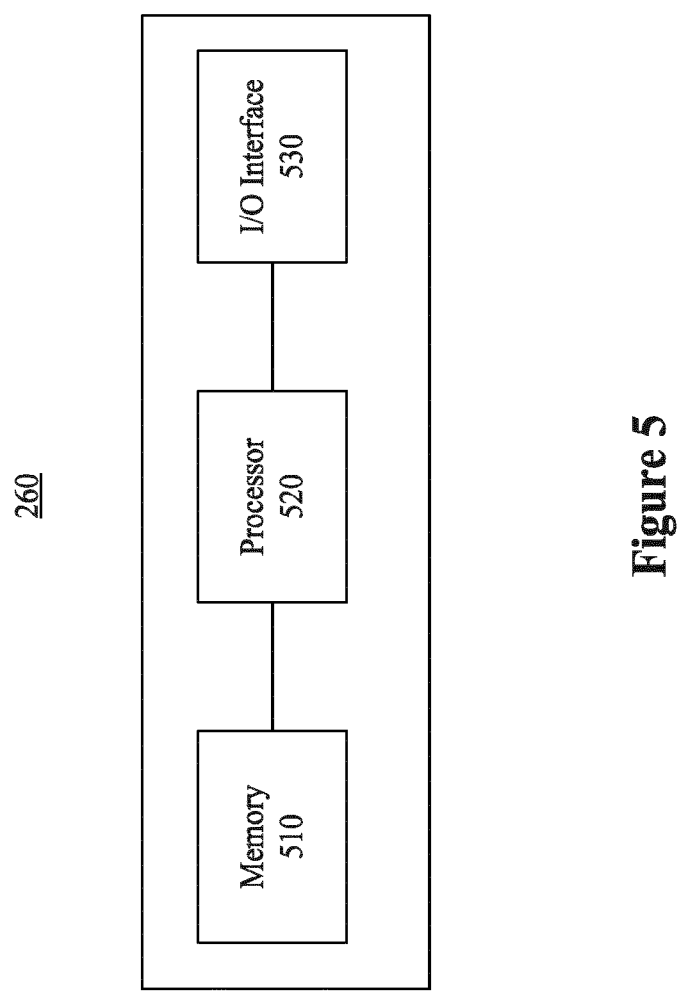
FIG. 5 is a block diagram of a controller included in the exemplary e-beam tool of FIG. 2, consistent with embodiments of the present disclosure.

Controller 260 may take many forms, including, for example, a computer-based system, a microprocessor-based system, a microcontroller, an embedded system (e.g., firmware), or any other suitable control circuit or system. In some embodiments, controller 260 is specially configured with hardware and/or software modules for switching on/off multipole lenses 240, 242, 250, 252 at set times, and precisely control or adjust the input voltage/current of multipole lenses 240, 242, 250, 252. FIG. 5 is a block diagram of a controller 260, consistent with the disclosed embodiments. Referring to FIG. 5, controller 260 may include a memory 510, a processor 520, and an input/output (I/O) interface 530.

Processor 520 may include one or more of an application-specific integrated circuit (ASIC), a field-programmable gate array (FPGA), and a logic circuit configured to allow controller 260 to function in accordance with the disclosed embodiments. Processor 520 may be configured to generate and transmit a control signal via, for example, I/O interface 530, to switch on/off or adjust the input voltage/current of one or more of the multipole lenses in e-beam tool 104.

In operation, processor 520 may execute computer instructions/logics stored in memory 510. Memory 510 may include any proper type of storage medium. Memory 510 may include a non-transitory computer-readable storage medium including instructions for applications or methods executable by processor 520. For example, the non-transitory computer-readable storage medium may be a read-only memory (ROM), a random access memory (RAM), a flash memory, a memory chip (or integrated circuit), or the like.

I/O interface 530 may include one or more digital and/or analog communication devices that allow controller 260 to communicate with other systems and devices. For example, I/O interface 530 may receive one or more control signals from processor 520, and send the control signals to a relay to switch on/off multipole lenses 240, 242, 250, 252.

Figure 6:
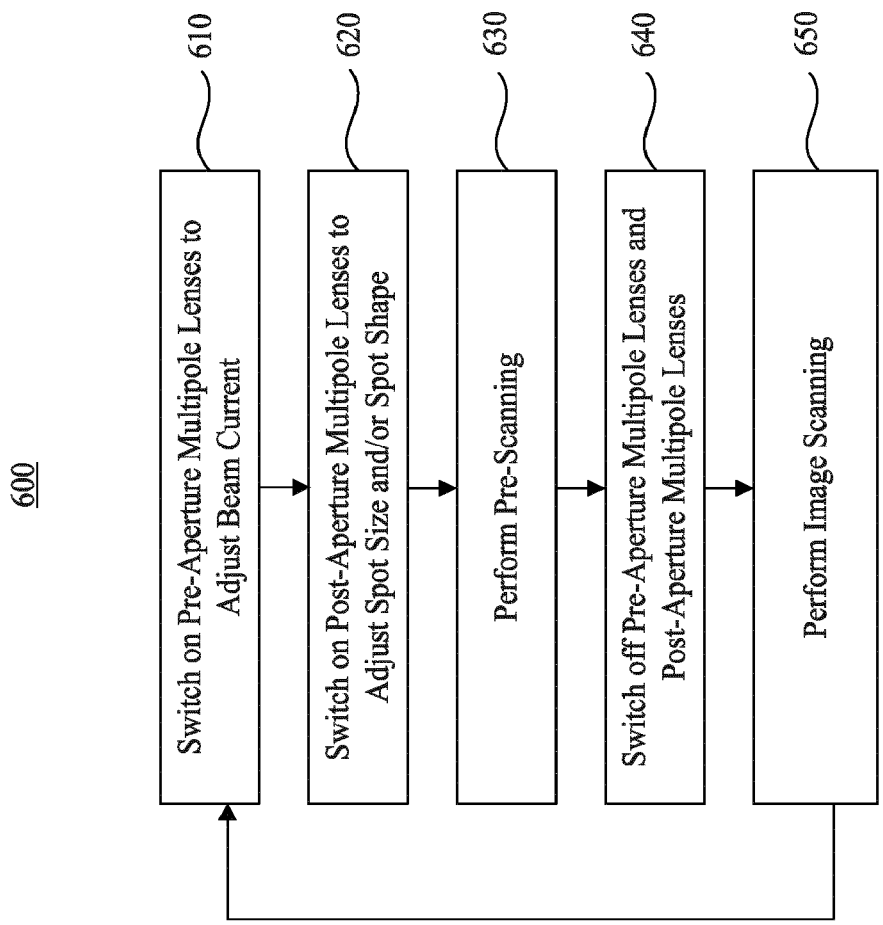
FIG. 6 is a flowchart of a method of controlling e-beam condition between pre-scanning and image scanning, consistent with embodiments of the present disclosure.

As described above, when the pre-scanning technique is used to pre-charge wafer 203, the primary electron beam is used to perform both the pre-scanning and imaging of a wafer. FIG. 6 is a flowchart of a method 600 of controlling e-beam conditions between pre-scanning and image scanning of a specimen, consistent with embodiments of the present disclosure. For example, method 600 may be used to control the beam condition of a primary electron beam in an e-beam tool (e.g., e-beam 104 shown in FIG. 2). The specimen inspected by the e-beam tool may be a semiconductor wafer (e.g., wafer 203). The e-beam tool includes one or more pre-aperture multipole lenses (e.g., apertures 240, 242 in e-beam tool 104) located upstream or above an aperture (e.g., objective aperture 208 in e-beam tool 104)

and one or more post-aperture lenses (e.g., apertures 250, 252 in e-beam tool 104) located downstream or below the aperture. The pre-aperture and post-aperture multipole lenses are disposed around an optical axis of the e-beam tool (e.g., optical axis 270 of e-beam tool). When switched on, pre-aperture and post-aperture multipole lenses may generate one or more multipole fields. The pre-aperture and post-aperture multipole lenses may be switched on/off by a controller (e.g., controller 260 in e-beam tool 104). Moreover, the controller may be configured to control the strength of the multipole fields by adjusting the input voltage and/or input current of the pre-aperture and post-aperture multipole lenses. Referring to FIG. 6, method 600 includes the following steps.

In step 610, during the pre-charging the specimen, the e-beam tool switches on the pre-aperture multipole lenses to adjust the beam current of the primary electron beam passing through the aperture 208. As described above, the pre-scanning and image scanning may require different beam currents. For example, a higher beam current of the primary electron beam may be needed to pre-charge defects with high leakage rate. As such, the pre-aperture multipole lenses may be switched on to increase the beam current of the primary electron beam that is projected onto the specimen.

In step 620, the e-beam tool switches on the post-aperture multipole lenses to adjust the spot size and/or spot shape of the primary electron beam, i.e., the size and/or shape of the probe spot formed by the primary electron beam on the specimen surface. For example, the spot size of the primary electron beam may be deceased, such that the charge density in the probe spot can be increased to satisfy the need of pre-charging the defects with high leakage rate. As another example, even if the specimen has no defect with high leakage rate, the pre-aperture multipole lenses and post-aperture multiple lens can be combined to increase the beam current and spot size simultaneously, such that the primary electron beam can cover a larger area of the specimen and shorten the time for pre-charging. This way, the throughput of the e-beam tool can be improved. As yet another example, the spot shape of the primary electron beam may be adjusted according to the particular types of features or defects in the pre-scanning area.

As described above, the strength of the pre-aperture and post-aperture multipole lenses may be precisely controlled. As such, consistent with the disclosed embodiments, the e-beam tool can adjust the strengths of the pre-aperture and post-aperture multipole lenses to change the bean current, spot size, and/or spot shape, according to the particular pre-scanning needs of different types of specimen and/or different types of defects on a specimen without changing the setting of condenser lenses or objective lenses.

In step 630, the e-beam tool pre-scans the specimen. In some embodiments, a motorized stage (e.g., stage 200 in e-beam 104) may move the specimen under the primary electron beam, to allow the primary electron beam to pre-scan a predefined area of the specimen. Alternatively or concurrently, the primary electron beam may be deflected by a deflector or a set of deflectors (e.g., deflector 204c) to pre-scan the predefined surface area. In this step, the primary beam current and probe spot is controlled by condenser lens 210, compound objective lens 204, pre-aperture multipole lenses, and post-aperture multipole lenses.

In step 640, after the predefined area of the specimen is pre-scanned, the e-beam tool switches off the pre-aperture multipole lenses and/or post-aperture multipole lenses, to change the beam current, spot size, and/or spot size of the primary electron beam back to those suitable for the image scanning In some embodiments, instead of completely switching off the multipole lenses, the e-beam tool may decrease or increase the strength of one or more of the pre-aperture and post-aperture multipole lenses, to make the beam condition meet the requirement of the image scanning.

In step 650, the e-beam performs image scanning of the predefined area of the specimen. After the predefined area is imaged, method 600 returns to step 610, to perform the pre-scanning and image scanning of a next predefined area of the specimen. With multiple iterations of method 600, the entire specimen may be pre-charged and imaged.

Consistent with the disclosed embodiments, the multipole fields generated by the pre-aperture and post-aperture multipole lenses can be changed rapidly. For example, as described above, an electrostatic round lens may need several thousands of volts to increase the beam current for pre-scanning In contrast, to achieve the same beam current, an electric multipole lens may only need a voltage on an order of hundreds of volts. As such, the multipole fields may be rapidly switched on/off or increased/decreased in several microseconds. Accordingly, the time needed for switching between pre-scanning and image scanning is reduced and the throughput of the e-beam tool is increased.

Figure 7:
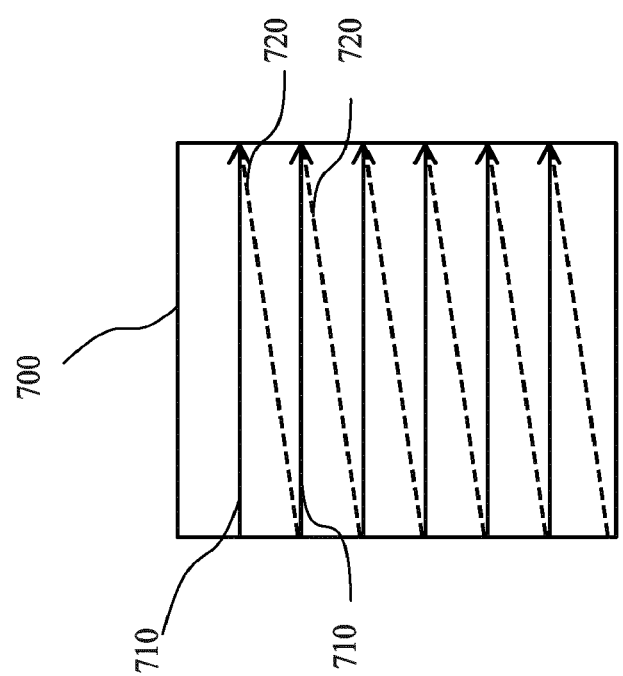
FIG. 7 is a simplified diagrammatic representation of an e-beam scanning pattern on a specimen surface, consistent with embodiments of the present disclosure.

Besides providing speedy switch of beam condition between pre-charging and image scanning, the pre-aperture and post-aperture multipole lenses may also be used to change beam condition in other use cases. FIG. 7 is a simplified diagrammatic representation of an e-beam scanning pattern on a specimen surface, consistent with embodiments of the present disclosure. FIG. 7 shows a plurality of scan lines 710 and a plurality of retrace lines 720 on a specimen surface 700. Scan lines 710 and retrace lines 720 represent the moving path of a probe spot formed by a primary electron beam on the specimen surface. During the imaging of the specimen, each scanning operation (represented by scan line 710) is followed by an immediate beam retracing operation (represented by retrace line 720). A beam retracing period is defined as a time interval between two scan lines 710. During the beam retracing period, the probe spot is directed from the end point of a previously formed imaging scan line 710 to the starting point of a next imaging scan line to be formed. No image scanning operation is performed during the beam retracing period.

Figure 8:
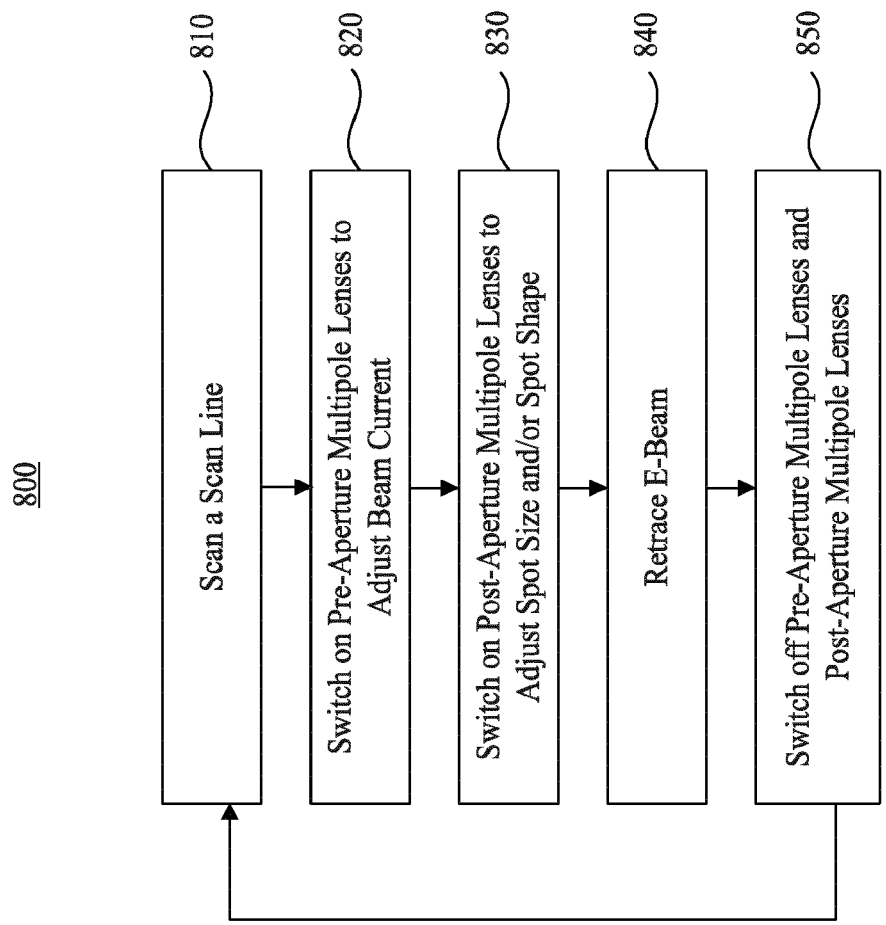
FIG. 8 is a flowchart of a method of controlling e-beam condition during image scanning, consistent with embodiments of the present disclosure.

FIG. 8 is a flowchart of a method 800 of controlling e-beam condition during imaging of a specimen with charged particles, consistent with embodiments of the present disclosure. For example, method 800 may be used to control the beam condition of a primary electron beam in an e-beam tool (e.g., e-beam 104 shown in FIG. 2) consisting of one or more pre-aperture multipole lenses and/or one or more post-aperture multipole lenses. Referring to FIG. 8, method 800 includes the following steps.

In step 810, the e-beam tool scans a scan line on a specimen surface. The scanning operation may be performed by deflecting a primary electron beam over the specimen surface, moving the specimen under the primary electron beam, or a combination thereof. During the scanning of each scan line, the primary beam current and probe spot at the wafer surface is controlled by a condenser lens (e.g., condenser lens 210 in e-beam tool 104) and an objective compound lens (e.g., objective compound lens 204 in e-beam tool 104).

In step 820, after the scan line operation is done, the e-beam tool switches on one or more pre-aperture multipole lenses to adjust the beam current of the primary electron beam projected onto the specimen surface. Step 820 is similar to step 610. For example, the multipole fields generated by the pre-aperture multipole lenses may increase the beam current.

In step 830, the e-beam tool switches on one or more post-aperture multipole lenses to adjust the spot size and/or spot shape of the probe spot formed by the primary electron beam on the specimen surface. Step 830 is similar to step 620. For example, the multipole field generated by the post-aperture multipole lenses may defocus the primary electron beam, i.e., enlarging the probe spot on the specimen surface.

In step 840, the e-beam tool retraces the primary electron beam. Similar to pre-scanning (step 630), the primary electron beam with the adjusted beam condition can be used to maintain or increase the level of charging on the specimen surface, so as to enhance the voltage contrast of the specimen.

In step 850, at the end of the retracing period, the e-beam tool switches off the pre-aperture and/or post-aperture multipole lenses to return the beam condition to the condition used for the scanning operation. Method 800 can then return to step 810, to scan the next scan line. With multiple iterations of method 800, the entire specimen can be imaged.

As describe above, because the multipole fields of the pre-aperture and post-aperture multipole lens can be switched on/off or adjusted rapidly, the time for switching beam condition between the scanning operation and retracing operation can be minimized.

Figure 9:
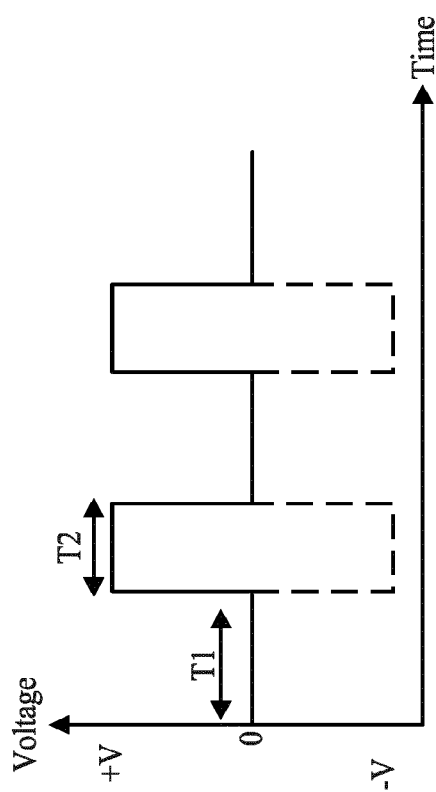
FIG. 9 is a schematic diagram illustrating a time sequence of switching on and off a multipole lens in the method of FIG. 8, consistent with embodiments of the present disclosure.

FIG. 9 is a schematic diagram illustrating a time sequence of switching on and off a multipole lens during the execution of method 800, consistent with the disclosed embodiments. In the illustrated example, the multipole lens is an electric multipole lens. Referring to FIG. 9, "$T_1$" refers to a beam scanning period and "$T_2$" refers to a beam retracing period. During each beam scanning period $T_1$, the electric multipole lens is switched off. During each beam retracing period $T_2$, the electric multipole lens is switched on, i.e., applying positive voltage +V and negative voltage −V to respective electrodes of the electric multipole lens. As shown in FIG. 9, the electric multipole lens can be switched on/off between the image scanning and beam retracing with little delay.

The embodiments may further be described using the following clauses:

1. An apparatus comprising:
    one or more first multipole lenses displaced above an aperture, the one or more first multipole lenses being configured to adjust a beam current of a charged-particle beam passing through the aperture; and
    one or more second multipole lenses displaced below the aperture, the one or more second multipole lenses being configured to adjust at least one of a spot size and a spot shape of the beam.
2. The apparatus of clause 1, further comprising:
    a controller configured to control strength of a multipole field generated by at least one of the one or more first multipole lenses or the one or more second multipole lenses.
3. The apparatus of clause 2, wherein the controller is further configured to:
    during a pre-scanning of a specimen, operate the one or more first multipole lenses to allow a first beam current to pass through the aperture; and
    when the beam scans a scan line during image scanning of the specimen, operate the one or more first multipole lenses to allow a second beam current to pass through the aperture, the first beam current being different from the second beam current.
4. The apparatus of clause 2, wherein the controller is further configured to:
    when the beam scans a scan line during image scanning of a specimen, operate the one or more first multipole lenses to allow a first beam current to pass through the aperture; and
    when the beam retraces between two scan lines during the image scanning of the specimen, operate the one or more first multipole lenses to allow a second beam current to pass through the aperture, the second beam current being different from the first beam current.
5. The apparatus of any one of clauses 2 through 4, wherein the controller is further configured to:
    during a pre-scanning of a specimen, switch on the one or more first multipole lenses; and
    when the beam scans a scan line during image scanning of the specimen, switch off the one or more first multipole lenses.
6. The apparatus of any one of clauses 2 through 5, wherein the controller is further configured to:
    when the beam scans a scan line during image scanning of a specimen, switch off the one or more first multipole lenses; and
    when the beam retraces between two scan lines during the image scanning of the specimen, switch on the one or more first multipole lenses.
7. The apparatus of any one of clauses 2 through 6, wherein the controller is further configured to:
    during a pre-scanning of a specimen, operate the one or more second multipole lenses to form a first beam spot on the specimen; and
    when the beam scans a scan line during image scanning of the specimen, operate the one or more second multipole lenses to form a second beam spot on the specimen, the first and second beam spots on the specimen having different sizes.
8. The apparatus of any one of clauses 2 through 6, wherein the controller is further configured to:
    when the beam scans a scan line during image scanning of a specimen, operate the one or more second multipole lenses to form a first beam spot on the specimen; and
    when the beam retraces between two scan lines during the image scanning of the specimen, operate the one or more second multipole lenses to form a second beam spot on the specimen, the first and second beam spots on the specimen having different sizes.
9. The apparatus of any one of clauses 2 through 8, wherein the controller is further configured to:
    during a pre-scanning of a specimen, switch on the one or more second multipole lenses; and
    when the beam scans the specimen, switch off the one or more second multipole lenses.
10. The apparatus of any one of clauses 2 through 9, wherein the controller is further configured to:
    when the beam scans a scan line during image scanning of a specimen, switch off the one or more second multipole lenses; and
    when the beam retraces between two scan lines during the image scanning of the specimen, switch on the one or more second multipole lenses.
11. The apparatus of any one of clauses 2 through 10, wherein:
    at least one of the one or more first multipole lenses and the one or more second multipole lenses is an electrostatic multipole lens; and the controller is further configured to switch on the electrostatic multipole lens by applying a voltage to the electrostatic multipole lens on an order of hundreds of volts.
12. The apparatus of any one of clauses 1 through 10, wherein at least one of the one or more first multipole lens and the one or more second multipole lens is an electrostatic multipole lens formed by a plurality of electrodes.
13. The apparatus of any one of clauses 1 through 10, wherein at least one of the one or more first multipole lens and the one or more second multipole lens is an electromagnetic multipole lens formed by a plurality of solenoid coils.
14. The apparatus of any one of clauses 1 through 13, further comprising:
 a particle source configured to generate the charged-particle beam.
15. The apparatus of any one of clauses 1 through 14, further comprising:
 a condenser lens displaced above the one or more first multipole lens, the condenser lens being configured to converge the beam.
16. The apparatus of any one of clauses 1 through 15, further comprising:
 a deflector or a set of deflectors displaced below the one or more second multipole lens, the deflector or the set of deflectors being configured to deflect the beam over surface of a specimen.
17. The apparatus of clause 16, wherein the deflector is further configured to deflect the beam over the surface of a specimen according to a predetermined pattern.
18. The apparatus of any one of clauses 1 through 17, further comprising:
 a compound objective lens displaced below the one or more second multipole lens, the compound objective lens being configured to generate an axially-symmetric magnetic field and an axially-symmetric electrostatic field, wherein the axially-symmetric magnetic field and axially-symmetric electrostatic field focus the beam.
19. The apparatus of any one of clauses 1 through 18, further comprising:
 a movable stage configured to support and move a specimen.
20. The apparatus of any one of clauses 1 through 19, wherein the one or more first multipole lens and the one or more second multipole lens include at least one quadrupole or octupole lens.
21. An apparatus comprising:
 one or more first non-rotational axially-symmetric lenses displaced above the aperture, the one or more first non-rotational axially-symmetric lenses being configured to adjust a beam current of a charged-particle beam passing through the aperture; and
 one or more second non-rotational axially-symmetric lenses displaced below the aperture, the one or more second non-rotational axially-symmetric lenses being configured to adjust at least one of a spot size or a spot shape of the beam.
22. The apparatus of clause 21, wherein at least one of the one or more first non-rotational axially-symmetric lenses and the one or more second non-rotational axially-symmetric lenses is an electrostatic lens formed by a plurality of electrodes symmetrically distributed around a path of the charged-particle beam.
23. The apparatus of clause 22, further comprising:
 a controller configured to switch on the electrostatic lens by applying a voltage to the electrostatic lens on an order of hundreds of volts.
24. The apparatus of clause 21, wherein at least one of the one or more first non-rotational axially-symmetric lenses and the one or more second non-rotational axially-symmetric lenses is an electromagnetic lens formed by a plurality of solenoid coils symmetrically distributed around a path of the charged-particle beam.
25. A method comprising:
 adjusting, by one or more first multipole lenses displaced above an aperture, a beam current of a charged-particle beam passing through the aperture; and
 adjusting, by one or more second multipole lenses displaced below the aperture, at least one of a spot size or a spot shape of the beam.
26. The method of clause 25, wherein adjusting the beam current passing through the aperture comprises:
 adjusting strength of a multipole field generated by at least one of the one or more first multipole lenses.
27. The method of any one of clauses 25 and 26, wherein adjusting the beam current passing through the aperture comprises:
 during a pre-scanning of a specimen, allowing, by the one or more first multipole lenses, a first beam current to pass through the aperture; and
 when the beam scans a scan line during image scanning of the specimen, allowing, by the one or more first multipole lenses, a second beam current to pass through the aperture, the first beam current being different from the second beam current.
28. The method of any one of clauses 25 and 26, wherein adjusting the beam current passing through the aperture comprises:
 when the beam scans a scan line during image scanning of a specimen, allowing, by the one or more first multipole lenses, a first beam current to pass through the aperture; and
 when the beam retraces between two scan lines during the image scanning of the specimen, allowing, by the one or more first multipole lenses, a second beam current to pass through the aperture, the second beam current being different from the first beam current.
29. The method of any one of clauses 25 through 28, wherein adjusting the beam current passing through the aperture comprises:
 during a pre-scanning of a specimen, switching on the one or more first multipole lenses; and
 when the beam scans the specimen, switching off the one or more first multipole lenses.
30. The method of any one of clauses 25 through 29, wherein adjusting the beam current passing through the aperture comprises:
 when the beam scans a scan line during image scanning of a specimen, switching off the one or more first multipole lenses; and
 when the beam retraces between two scan lines during the image scanning of the specimen, switching on the one or more first multipole lenses.
31. The method of any one of clauses 25 through 30, wherein adjusting at least one of the spot size or the spot shape of the beam comprises:
 adjusting strength of a multipole field generated by at least one of the one or more second multipole lenses.

32. The method of any one of clauses 25 through 31, wherein adjusting at least one of the spot size or the spot shape of the beam comprises:
   during a pre-scanning of a specimen, forming, by the one or more second multipole lenses, a first beam spot on the specimen; and
   when the beam scans a scan line during image scanning of the specimen, forming, by the one or more second multipole lenses, a second beam spot on the specimen, the first and second beam spots on the specimen having different sizes.

33. The method of any one of clauses 25 through 31, wherein adjusting at least one of the spot size or the spot shape of the beam comprises:
   when the beam scans a scan line during image scanning of a specimen, forming, by the one or more second multipole lenses, a first beam spot on the specimen; and
   when the beam retraces between two scan lines during the image scanning of the specimen, forming, by the one or more second multipole lenses, a second beam spot on the specimen, the first and second beam spots on the specimen having different sizes.

34. The method of any one of clauses 25 through 33, wherein adjusting at least one of the spot size or the spot shape of the beam comprises:
   during a pre-scanning of a specimen, switching on the one or more second multipole lenses; and
   when the beam scans the specimen, switching off the one or more second multipole lenses.

35. The method of any one of clauses 25 through 34, wherein adjusting at least one of the spot size or the spot shape of the beam comprises:
   when the beam scans a scan line during image scanning of a specimen, switching off the one or more second multipole lenses; and
   when the beam retraces between two scan lines during the image scanning of the specimen, switching on the one or more second multipole lenses.

36. The method of any one of clauses 25 through 35, wherein:
   at least one of the one or more first multipole lenses and the one or more second multipole lenses is an electrostatic multipole lens; and
   the method further comprises switching on the electrostatic multipole lens by applying a voltage to the electrostatic multipole lens on an order of hundreds of volts.

37. The method of any one of clauses 25 through 36, wherein the one or more first multipole lens and the one or more second multipole lens include at least one quadrupole or octupole lens.

38. A non-transitory computer-readable medium storing instructions that, when executed by one or more processors, cause the processors to perform a method comprising:
   controlling one or more first multipole lenses displaced above an aperture, to adjust a beam current of a charged-particle beam passing through the aperture; and
   controlling one or more second multipole lenses displaced below the aperture, to adjust at least one of a spot size or a spot shape of the beam.

39. The non-transitory computer-readable medium of clause 38, wherein controlling the one or more first multipole lenses comprises:
   adjusting strength of a multipole field generated by at least one of the one or more first multipole lenses.

40. The non-transitory computer-readable medium of any one of clauses 38 and 39, wherein controlling the one or more first multipole lenses comprises:
   during a pre-scanning of a specimen, controlling the one or more first multipole lenses, to allow a first beam current to pass through the aperture; and
   when the beam scans a scan line during image scanning of the specimen, controlling the one or more first multipole lenses, to allow a second beam current to pass through the aperture, the first beam current being higher than the second beam current.

41. The non-transitory computer-readable medium of any one of clauses 38 and 39, wherein controlling the one or more first multipole lenses comprises:
   when the beam scans a scan line during image scanning of a specimen, controlling the one or more first multipole lenses, to allow a first beam current to pass through the aperture; and
   when the beam retraces between two scan lines during the image scanning of the specimen, controlling the one or more first multipole lenses, to allow a second beam current to pass through the aperture, the second beam current being different from the first beam current.

42. The non-transitory computer-readable medium of any one of clauses 38 through 41, wherein controlling the one or more first multipole lenses comprises:
   during a pre-scanning of a specimen, switching on the one or more first multipole lenses; and
   when the beam scans the specimen, switching off the one or more first multipole lenses.

43. The non-transitory computer-readable medium of any one of clauses 38 through 42, wherein controlling the one or more first multipole lenses comprises:
   when the beam scans a scan line during image scanning of a specimen, switching off the one or more first multipole lenses; and
   when the beam retraces between two scan lines during the image scanning of the specimen, switching on the one or more first multipole lenses.

44. The non-transitory computer-readable medium of any one of clauses 38 through 43, wherein controlling the one or more second multipole lenses comprises:
   adjusting strength of a multipole field generated by at least one of the one or more second multipole lenses.

45. The non-transitory computer-readable medium of any one of clauses 38 through 44, wherein controlling the one or more second multipole lenses comprises:
   during a pre-scanning of a specimen, controlling the one or more second multipole lenses, to form a first beam spot on the specimen; and
   when the beam scans a scan line during image scanning of the specimen, controlling the one or more second multipole lenses, to form a second beam spot on the specimen, the first and second beam spots on the specimen having different sizes.

46. The non-transitory computer-readable medium of any one of clauses 38 through 44, wherein controlling the one or more second multipole lenses comprises:
   when the beam scans a scan line during image scanning of a specimen, controlling the one or more second multipole lenses, to form a first beam spot on the specimen; and
   when the beam retraces between two scan lines during the image scanning of the specimen, controlling the one or more second multipole lenses, to form a second beam spot on the specimen, the first and second beam spots on the specimen having different sizes.

47. The non-transitory computer-readable medium of any one of clauses 38 through 46, wherein controlling the one or more second multipole lenses comprises:
during a pre-scanning of a specimen, switching on the one or more second multipole lenses; and
when the beam scans the specimen, switching off the one or more second multipole lenses.

48. The non-transitory computer-readable medium of any one of clauses 38 through 47, wherein controlling the one or more second multipole lenses comprises:
when the beam scans a scan line during image scanning of a specimen, switching off the one or more second multipole lenses; and
when the beam retraces between two scan lines during the image scanning of the specimen, switching on the one or more second multipole lenses.

49. The non-transitory computer-readable medium of any one of clauses 38 through 48, wherein:
at least one of the one or more first multipole lenses and the one or more second multipole lenses is an electrostatic multipole lens; and
the method further comprises switching on the electrostatic multipole lens by applying a voltage to the electrostatic multipole lens on an order of hundreds of volts.

It will be appreciated that the present invention is not limited to the exact construction that has been described above and illustrated in the accompanying drawings, and that various modifications and changes can be made without departing from the scope thereof. It is intended that the scope of the invention should only be limited by the appended claims.

What is claimed is:

1. An apparatus comprising:
one or more first non-rotational axially-symmetric lenses displaced above an aperture, the one or more first non-rotational axially-symmetric lenses being configured to adjust a beam current of a charged-particle beam passing through the aperture; and
one or more second non-rotational axially-symmetric lenses displaced below the aperture, the one or more second non-rotational axially-symmetric lenses being configured to adjust at least one of a spot size or a spot shape of the charged particle beam.

2. The apparatus of claim 1, wherein at least one of the one or more first non-rotational axially-symmetric lenses and the one or more second non-rotational axially-symmetric lenses is an electrostatic lens formed by a plurality of electrodes symmetrically distributed around a path of the charged-particle beam.

3. The apparatus of claim 2, further comprising:
a controller configured to switch on the electrostatic lens by applying a voltage to the electrostatic lens on an order of hundreds of volts.

4. The apparatus of claim 1, wherein at least one of the one or more first non-rotational axially-symmetric lenses and the one or more second non-rotational axially-symmetric lenses is an electromagnetic lens formed by a plurality of solenoid coils symmetrically distributed around a path of the charged-particle beam.

5. The apparatus of claim 1, further comprising a controller configured to:
control the one or more first non-rotational axially-symmetric lenses displaced above the aperture, to adjust the beam current of the charged-particle beam passing through the aperture; and
control the one or more second non-rotational axially-symmetric lenses displaced below the aperture, to adjust the at least one of the spot size or the spot shape of the charged-particle beam.

6. A non-transitory computer-readable medium that stores a set of instructions that is executable by at least one processor of an apparatus to cause the apparatus to perform a method comprising:
controlling one or more first non-rotational axially-symmetric lenses displaced above an aperture, to adjust a beam current of a charged-particle beam passing through the aperture; and
controlling one or more second non-rotational axially-symmetric lenses displaced below the aperture, to adjust at least one of a spot size or a spot shape of the charged-particle beam.

7. The non-transitory computer-readable medium of claim 6, wherein controlling the one or more first non-rotational axially-symmetric lenses comprises:
adjusting a strength of a multipole field generated by at least one of the one or more first non-rotational axially-symmetric lenses.

8. The non-transitory computer-readable medium of claim 6, wherein controlling the one or more first non-rotational axially-symmetric lenses comprises:
during a pre-scanning of a specimen, controlling the one or more first non-rotational axially-symmetric lenses, to allow a first beam current to pass through the aperture; and
when the beam scans a scan line during image scanning of the specimen, controlling the one or more first non-rotational axially-symmetric lenses, to allow a second beam current to pass through the aperture, the first beam current being higher than the second beam current.

9. The non-transitory computer-readable medium of claim 6, wherein controlling the one or more first non-rotational axially-symmetric lenses comprises:
when the beam scans a scan line during image scanning of a specimen, controlling the one or more first non-rotational axially-symmetric lenses, to allow a first beam current to pass through the aperture; and
when the beam retraces between two scan lines during the image scanning of the specimen, controlling the one or more first non-rotational axially-symmetric lenses, to allow a second beam current to pass through the aperture, the second beam current being different from the first beam current.

10. The non-transitory computer-readable medium of claim 6, wherein controlling the one or more first non-rotational axially-symmetric lenses comprises:
during a pre-scanning of a specimen, switching on the one or more first non-rotational axially-symmetric lenses; and
when the beam scans the specimen, switching off the one or more first non-rotational axially-symmetric lenses.

11. The non-transitory computer-readable medium of claim 6, wherein controlling the one or more first non-rotational axially-symmetric lenses comprises:
when the beam scans a scan line during image scanning of a specimen, switching off the one or more first non-rotational axially-symmetric lenses; and when the beam retraces between two scan lines during the image scanning of the specimen, switching on the one or more first non-rotational axially-symmetric lenses.

12. The non-transitory computer-readable medium of claim 6, wherein controlling the one or more second non-rotational axially-symmetric lenses comprises:
adjusting strength of a multipole field generated by at least one of the one or more second non-rotational axially-symmetric lenses.

13. The non-transitory computer-readable medium of claim 6, wherein controlling the one or more second non-rotational axially-symmetric lenses comprises:
during a pre-scanning of a specimen, controlling the one or more second non-rotational axially-symmetric lenses, to form a first beam spot on the specimen; and
when the beam scans a scan line during image scanning of the specimen, controlling the one or more second non-rotational axially-symmetric lenses, to form a second beam spot on the specimen, the first and second beam spots on the specimen having different sizes.

14. The non-transitory computer-readable medium of claim 6, wherein controlling the one or more second non-rotational axially-symmetric lenses comprises:
when the beam scans a scan line during image scanning of a specimen, controlling the one or more second non-rotational axially-symmetric lenses, to form a first beam spot on the specimen; and
when the beam retraces between two scan lines during the image scanning of the specimen, controlling the one or more second non-rotational axially-symmetric lenses, to form a second beam spot on the specimen, the first and second beam spots on the specimen having different sizes.

15. The non-transitory computer-readable medium of claim 6, wherein controlling the one or more second non-rotational axially-symmetric lenses comprises:
during a pre-scanning of a specimen, switching on the one or more second non-rotational axially-symmetric lenses; and
when the beam scans the specimen, switching off the one or more second non-rotational axially-symmetric lenses.

16. The non-transitory computer-readable medium of claim 6, wherein controlling the one or more second non-rotational axially-symmetric lenses comprises:
when the beam scans a scan line during image scanning of a specimen, switching off the one or more second non-rotational axially-symmetric lenses; and
when the beam retraces between two scan lines during the image scanning of the specimen, switching on the one or more second non-rotational axially-symmetric lenses.

17. The non-transitory computer-readable medium of claim 6, wherein at least one of the one or more first non-rotational axially-symmetric lenses is an electrostatic lens formed by a plurality of electrodes symmetrically distributed around a path of the charged-particle beam.

18. The non-transitory computer-readable medium of claim 6, wherein at least one of the one or more second non-rotational axially-symmetric lenses is an electrostatic lens formed by a plurality of electrodes symmetrically distributed around a path of the charged-particle beam.

19. The non-transitory computer-readable medium of claim 6, wherein at least one of the one or more first non-rotational axially-symmetric lenses is an electromagnetic lens formed by a plurality of solenoid coils symmetrically distributed around a path of the charged-particle beam.

20. The non-transitory computer-readable medium of claim 6, wherein at least one of the one or more second non-rotational axially-symmetric lenses is an electromagnetic lens formed by a plurality of solenoid coils symmetrically distributed around a path of the charged-particle beam.

* * * * *